United States Patent
Snow et al.

(10) Patent No.: US 6,191,744 B1
(45) Date of Patent: Feb. 20, 2001

(54) PROBE MOVEMENT SYSTEM FOR SPHERICAL NEAR-FIELD ANTENNA TESTING

(76) Inventors: Jeffrey Snow, 3519 Westminster Way, Bloomington, IN (US) 47401; Kenneth Thompson, 1502 State St., Washington, IN (US) 47501

( * ) Notice: Under 35 U.S.C. 154(b), the term of this patent shall be extended for 0 days.

(21) Appl. No.: 09/406,462

(22) Filed: Sep. 27, 1999

(51) Int. Cl.$^7$ .................................................. G01R 1/24
(52) U.S. Cl. .................... 343/703; 343/766; 343/765; 342/360
(58) Field of Search ................................ 343/703, 766, 343/765, 806; 342/360

(56) References Cited

U.S. PATENT DOCUMENTS

| | | | |
|---|---|---|---|
| 3,166,748 | 1/1965 | Shanks et al. | 343/100 |
| 3,879,733 | 4/1975 | Hansen et al. | 343/100 |
| 4,201,987 | 5/1980 | Tricoles et al. | 343/703 |
| 4,453,164 | 6/1984 | Patton | 343/360 |
| 4,553,145 | 11/1985 | Evans | 343/360 |
| 4,661,820 | 4/1987 | Pouit et al. | 342/351 |
| 4,704,614 | 11/1987 | Poirier et al. | 343/703 |
| 5,270,723 | 12/1993 | Lopez et al. | 343/703 |
| 5,365,241 | 11/1994 | Williams et al. | 343/703 |
| 5,410,319 | 4/1995 | Lopez et al. | 342/360 |
| 5,432,523 | 7/1995 | Simmers et al. | 343/703 |
| 5,473,335 * | 12/1995 | Tines | 343/766 |
| 5,485,158 * | 1/1996 | Mailloux et al. | 342/165 |
| 5,999,139 * | 12/1999 | Benjamin et al. | 343/765 |
| 6,023,247 * | 2/2000 | Rodeffer | 343/765 |

OTHER PUBLICATIONS

"Spherical Near–Field Antenna Measurements" (p. 168) Ed by J.E. Hansen, PUB. Peter Peregrinus LTD, London UK 1988.

\* cited by examiner

Primary Examiner—Tan Ho
Assistant Examiner—Tuyet T. Vo

(57) ABSTRACT

A probe movement apparatus for spherical near-field antenna testing moves a probe (22) over a spherical measurement surface or path by two bent cantilevered arms (14 and 18). A positioner (12 or 16) rotates each arm (14 and 18). An elevation positioner (16) is mounted on the tip of an azimuth arm (12) The azimuth positioner (12) is mounted on a base (10). The rotation axes of the two positioners (12 and 16) intersect and are orthogonal. The axes intersection point defines the center of the measurement sphere. The antenna (32) is mounted within the measurement sphere on an anti-spin bearing (26) on the azimuth arm (14) centered above the azimuth positioner (12). A shaft (28) connects to the anti-spin bearing, extends down though the azimuth arm (14) and positioner (12) and connects to an anti-spin positioner (30). The anti-spin positioner (30) attaches to the base (10) and holds the antenna (32) stationary. Optionally, the anti-spin positioner (30) may rotate the antenna (32) to check for and minimize the effect of radio frequency reflections.

4 Claims, 4 Drawing Sheets

PROBE MOVEMENT SYSTEM FOR SPHERICAL NEAR-FIELD ANTENNA TESTING

CROSS-REFERENCE TO RELATED APPLICATIONS

Not applicable

BACKGROUND—FIELD OF INVENTION

This invention relates to a probe movement system for spherical near-field antenna testing.

BACKGROUND—DESCRIPTION OF PRIOR ART

Near-field testing of an antenna is a technique that calculates the far-field antenna pattern from multiple radio frequency (RF) measurements taken very close to the antenna. The far-field antenna pattern is of vital concern to a system that uses an antenna. The far-field pattern details the direction and shape of the antenna main beam and the sidelobes. Sidelobes show where and how much an antenna will pick up or send signals outside of the main beam. Designers normally try to make sidelobes as small as possible. Near-field testing has several advantages over direct far-field testing. Near-field results are usually more accurate due to better control of reflections. Near-field testing can usually be done indoors in controlled conditions. The data from near-field testing can be manipulated (back transformed) to find malfunctioning elements in an array antenna.

In near-field testing a probe (a small antenna) is moved over a plane in front of the antenna or over a cylindrical or spherical surface enclosing the antenna. The probe emits or receives RF to or from the antenna. The amplitude and phase of the received RF signal is recorded at specific and equally spaced probe locations. A computer program manipulates this data and predicts the far-field pattern. The increasing power of digital computers has made the near-field technique much easier and faster to use.

In most spherical near-field antenna testing two orthogonal axes describe probe movement over the spherical surface. The axes are usually called azimuth and elevation or phi and theta. For high accuracy the two axes must be close to 90°, the probe must at a constant radius, and the probe position must be accurately known. In most spherical near-field antenna testing the antenna is rotated in at least one axis to cause an effective probe movement over the spherical surface.

An exception to moving the antenna is a double gantry arm design shown on page 168 of "Spherical Near-Field Antenna Measurements" edited by J. E. Hansen Published by Peter Peregrinus LTD, London, United Kingdom 1988. The probe is moved in two axes by a double gantry arm with the antenna held stationary on a nearby post. The upper (elevation) arm which moves the probe in elevation is not counterweighted therefore movement of the arm requires more torque and power. Also, movement of the arm causes changing stress and strain in the supporting azimuth arm and base resulting in errors in the probe location. The lower (azimuth) arm which moves the probe and elevation arm in azimuth is not counterweighted therefore movement of the azimuth arm causes changing stress and strain in the supporting base resulting in errors in the probe location. The antenna support post limits the rotation of the lower azimuth arm. This post limits the area where the far-field pattern can be calculated and/or increase errors due to increased RF reflection into the antenna or probe.

There are several U.S. patents that discuss obtaining far-field patterns from near-field data without any discussion how a probe is moved. These patents are: U.S. Pat. Nos. 3,166,748 to Shanks et al., 3,879,733 to Hansen et al., 4,553,145 to Evans, 5,270,723 to Lopez et al., 5,410,319 to Lopez et al., 5,432,523 to Simmers Several other U.S. patents discuss specific probe movement in near-field testing. These patents require some movement of the antenna or are not spherical near-field antenna testing with the antenna inside the sphere. These patents are:

U.S. Pat. No. 4,201,987 to Tricoles and Rope discusses spherical near-field techniques. The patent does discuss probe movement. The probe is moved over a circular path by two orthogonal linear movements (a vertical post and extending arm). The probe is simultaneously rotated to continuously point at the center of a sphere. The antenna is rotated to provide the other axis of movement U.S. Pat. No. 4,453,164 to Patton discusses the use of near-field data. The only type of probe movement discussed is planar.

U.S. Pat. No. 4,661,820 to Pouit et al. discusses obtaining far-field pattern from near-field data. The patent discusses rotating the antenna in azimuth and optionally in elevation. If the antenna doesn't move in elevation the probe does, otherwise the probe is fixed.

U.S. Pat. No. 4,704,614 to Poirier et al. discusses obtaining far-field pattern from near-field data. The patent does discuss probe movement. The method used is a type of distorted planner near-field. The antenna under test is stationary and faces upward. A Foucault pendulum is positioned over the antenna and a probe is attached to the end of the pendulum. The pendulum is swung and the Earth's rotation causes the pendulum swing direction to rotate over the face of the antenna. The probe path describes a sphere segment. The amount of far-field patterns that can be obtained is limited because the antenna is external to the sphere.

U.S. Pat. No. 5,365,241 to Williams discusses planar near-field techniques. This patent does discuss probe movement. The probe moves over a planar surface swinging on an arm while the antenna is rotated underneath.

SUMMARY

A probe movement apparatus for spherical near-field antenna testing that moves a probe over a spherical measurement surface or path by two bent cantilevered (gantry) arms. The antenna under test is located within the spherical surface and can be held stationary during testing.

Objects and Advantages

Accordingly, besides the objects and advantages of the probe movement system described in my above patent, several objects and advantages of the present invention are:

(a) to perform spherical near-field testing while keeping the antenna stationary this prevents movement or twisting of waveguide and cables connected to the antenna which increases test accuracy;

(b) the antenna can be tested in it's normal orientation which improves accuracy when gravity or thermal loads are significant;

(c) deflections in the base portion effect both the antenna position and probe position equally, this improves accuracy, and allows a less rigid, cheaper, and more portable base;

(d) the antenna may be rotated slightly to check for or minimize RF reflections increasing accuracy;

(e) the counterweight on the elevation arm improves accuracy by eliminating changing stress and strain on the azimuth arm as the elevation arm moves;

(f) the freedom to rotate the azimuth arm through 360° allows the azimuth arm two possible positions for each probe position this can be used to minimize RF reflections increasing accuracy.

Still further objects and advantages will become apparent from a consideration of the ensuing description and drawings.

DRAWING FIGURES

Figure 1:
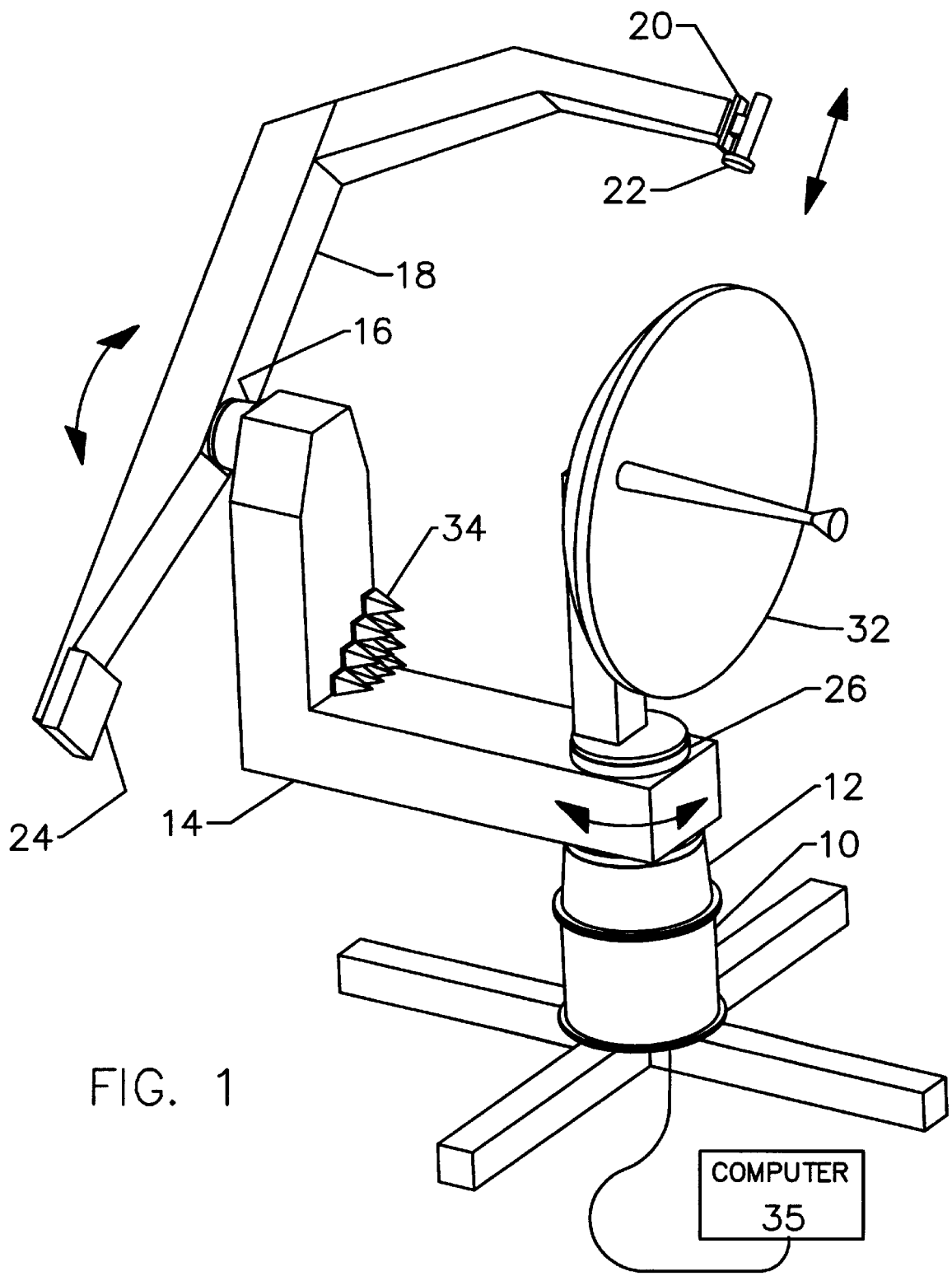
FIG. 1 shows the overall probe movement apparatus.
Figure 2:
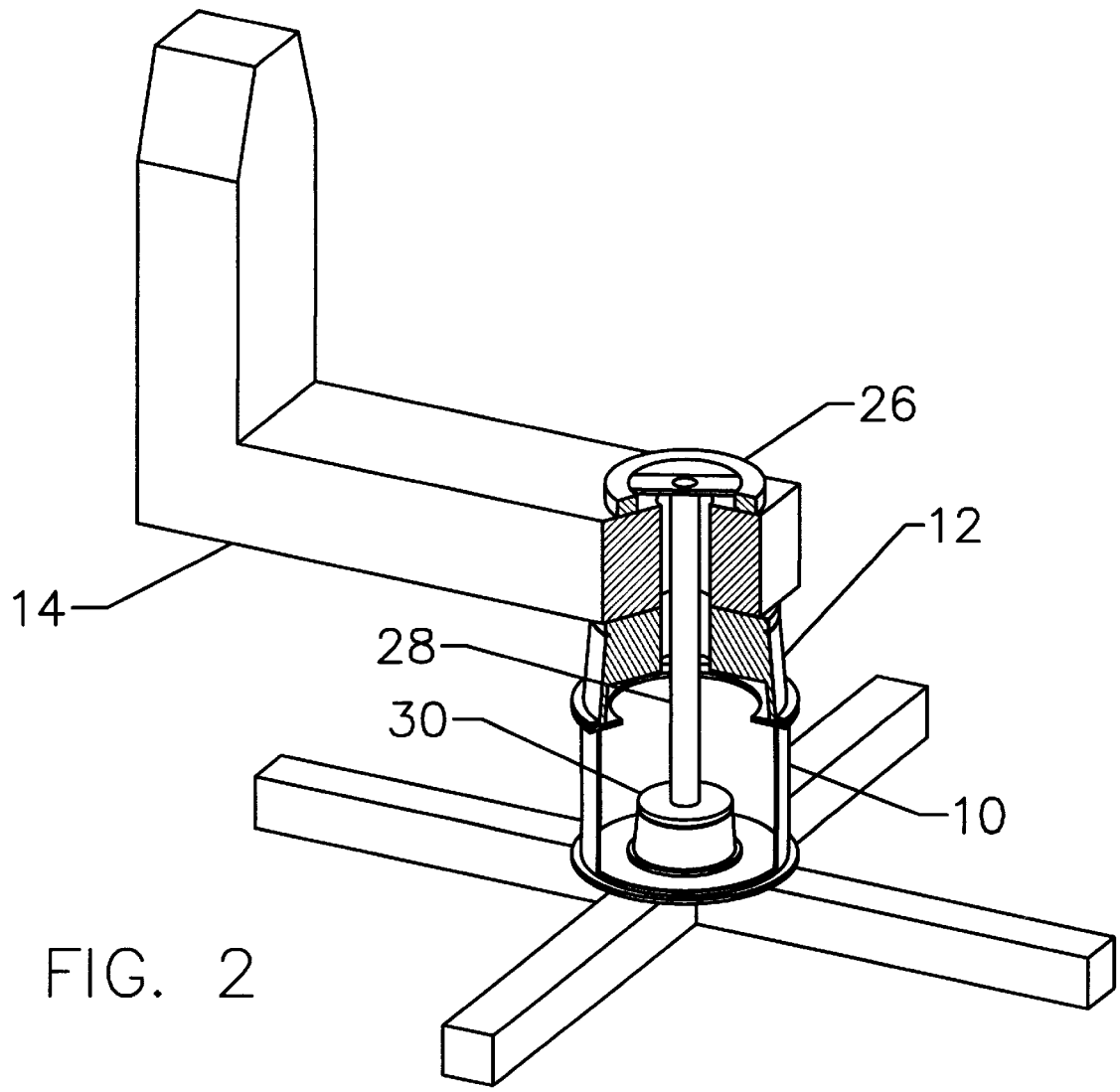
FIG. 2 shows a portion of the probe movement apparatus with cutouts to show internal components.

Reference Numerals In Drawings 10 base
12 azimuth rotary positioner
14 bent cantilevered azimuth arm
16 elevation rotary positioner
18 bent cantilevered elevation arm
20 linear positioner
22 RF probe
24 elevation arm counterweight
26 anti-spin bearing
28 anti-spin shaft
30 anti-spin rotary positioner
32 antenna-under-test
34 microwave absorber
35 computer
36 counter-spin rotary positioner
38 off-set post DESCRIPTION—FIGS. 1 and 2 Preferred Embodiment A preferred embodiment of the probe movement apparatus is illustrated in FIG. 1 and FIG. 2. A base 10 supports an azimuth rotary positioner 12. Rotary positioners are powered turntables which can turn to a specified angle direction or turn at a specified angular speed. These positioners are available as standard commercial equipment—available through MI Technologies of Atlanta Georgia and other companies. A bent cantilevered azimuth arm 14 attaches to the top of azimuth positioner 12. An elevation rotary positioner 16 attaches to the tip of azimuth arm 14 such that the axis of rotation of elevation positioner 16 intersects and is orthogonal to the axis of rotation of azimuth positioner 12. A bent cantilevered elevation arm 18 is attached to elevation positioner 16. A linear positioner 20 is mounted to the end of elevation arm 18 such that the direction of movement points through the intersection of the rotation axes of positioners 12 and 16. A radio frequency probe 22 is attached to the moving portion of linear positioner 20. A counterweight 24 is attached to the opposite end of elevation arm 18 to balance the arm.

An anti-spin bearing 26 is mounted on top of azimuth arm 14. Anti-spin bearing 26 is located such that its' rotation axis and that of azimuth positioner 12 are coincident. An antenna-under-test 32 mounts on the top of anti-spin bearing 26. Anti-spin bearing 26 allows the antenna to rotate independent of azimuth arm 14. A hollow anti-spin shaft 28 attaches to the top of anti-spin bearing 26. Shaft 28 extends down through azimuth arm 14, and azimuth positioner 12 and attaches to an anti-spin rotary positioner 30. Anti-spin positioner 30 is located in and attaches to base 10. Microwave (RF) absorber 34 is attached to all portions of the probe movement apparatus as necessary to reduce reflections. A computer 35 connects to all positioners.

The amount of deflection of elevation arm 18 changes with its angle to the ground. This deflection changes the effective axis that probe 22 moves about. Near-field test accuracy is improved by adjusting the angle between the rotation axes of the azimuth and elevation positioners 12 and 16. The positioners are adjusted or aligned so that the effective movement axis of probe 22 is perpendicular to the rotation axis of azimuth positioner 12.

Additional Embodiments

Figure 3:
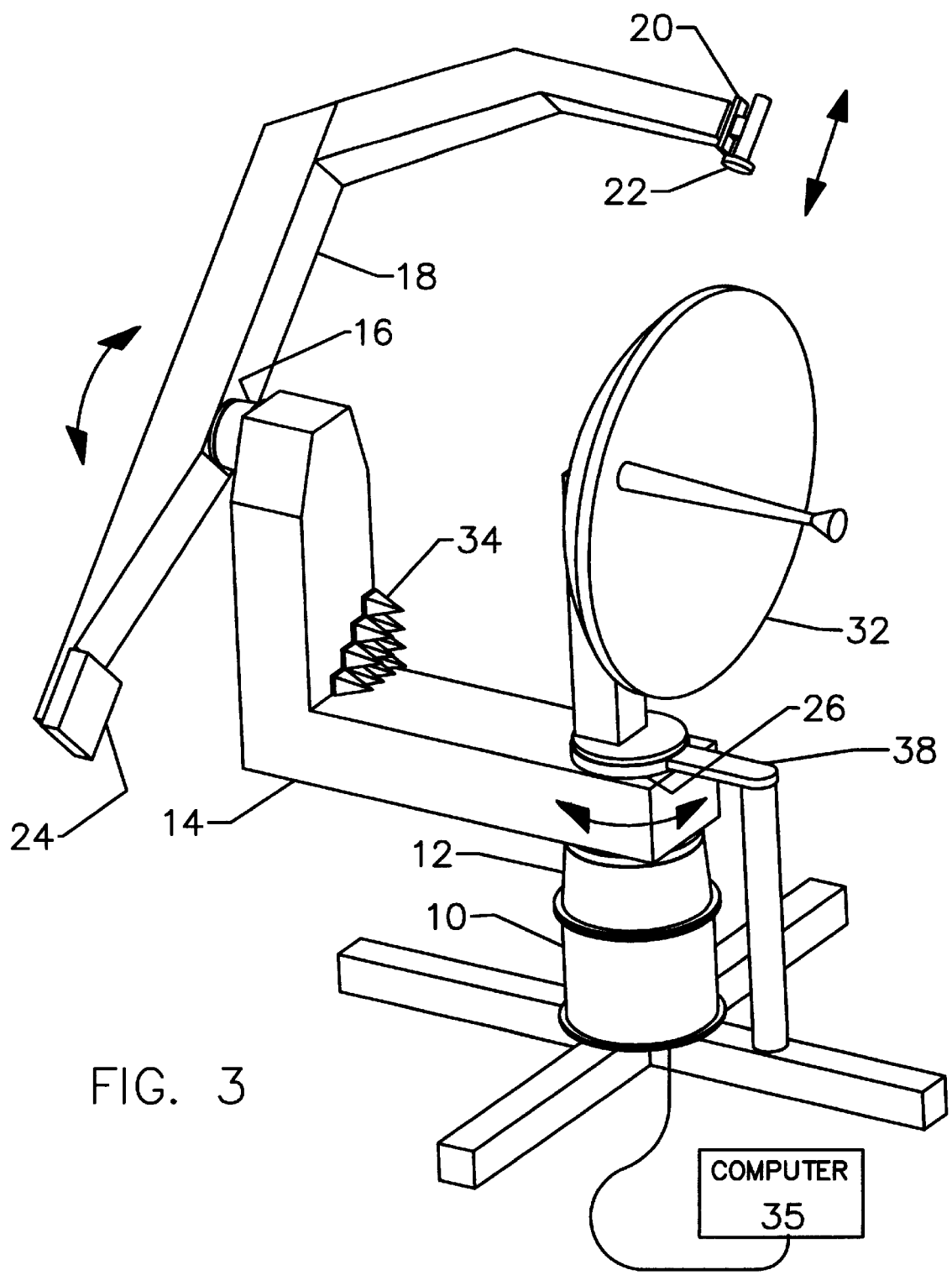
FIG. 3 shows an additional embodiment using an offset post instead of an anti-spin shaft.
Figure 4:
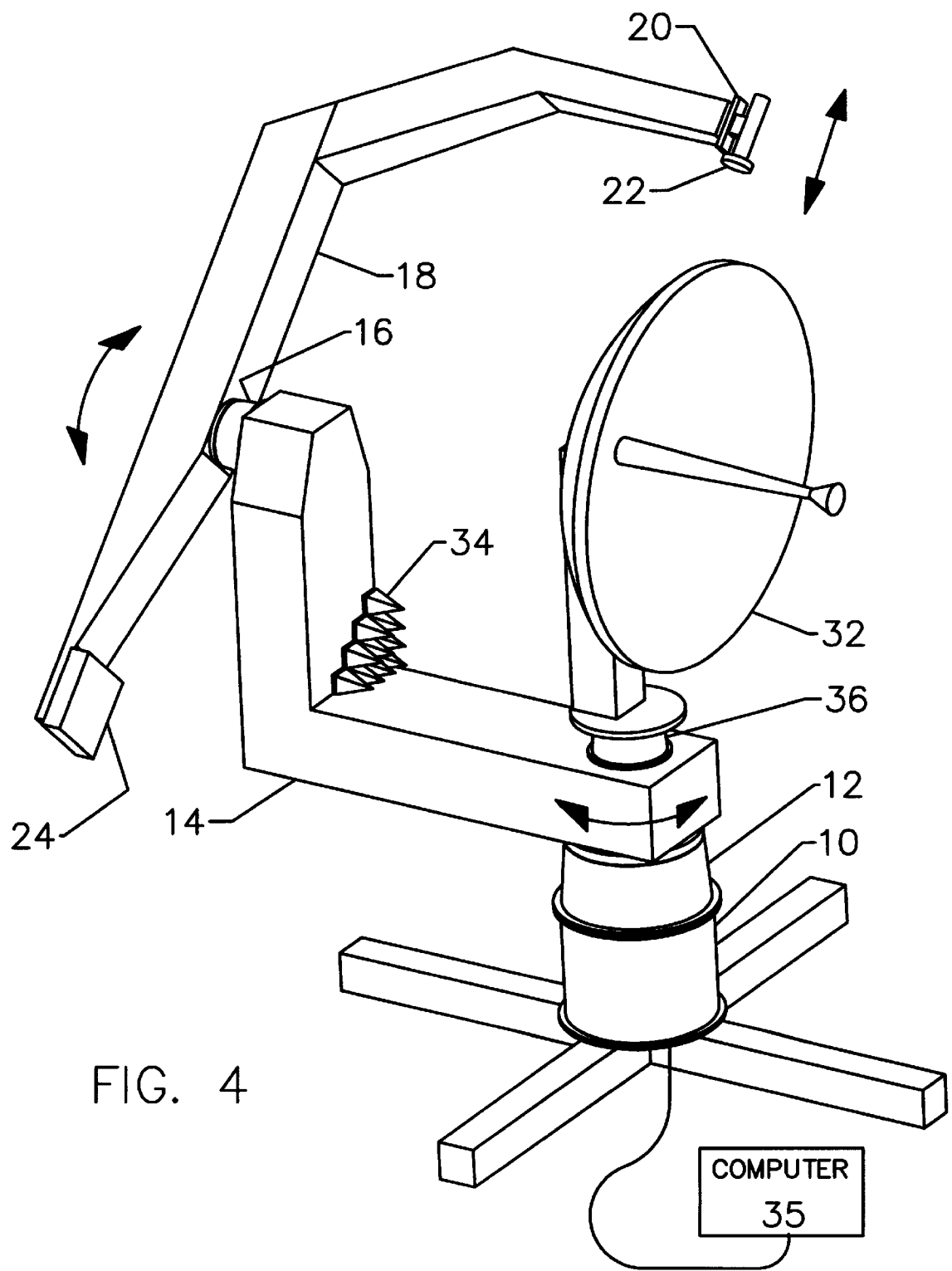
FIG. 4 shows an additional embodiment using a counter-spin positioner instead of anti-spin bearing, anti-spin shaft, and anti-spin positioner.

1. Anti-spin positioner 30 is eliminated and anti-spin shaft 28 directly secured to base 10.
2. Counterweight 24 is eliminated.
3. Linear positioner 20 is eliminated and probe 22 attached directly to the end of elevation arm 18.
4. As shown in FIG. 3 an off-set post 34 attaches to the base 10. Post 34 extends upward and over to attach to the upper portion of anti-spin bearing 26. Thusly rotation of antenna-under-test 32 is prevented as azimuth arm 14 rotates. Therefore anti-spin shaft 28 and anti-spin positioner 30 are not required.
5. As shown in FIG. 4 a counter-spin rotary positioner 36 is attached in place of anti-spin bearing 26. Therefore anti-spin shaft 28, and anti-spin positioner 30 are not required.

Operation

As shown in FIG. 1 antenna-under-test 32 mounts onto anti-spin bearing 26. Cables and waveguides required to test the antenna are routed through hollow anti-spin shaft 28. Computer 35 sends commands to azimuth and elevation positioners 12 and 16. These commands move probe 22 over a spherical surface as required to take adequate radio frequency (RF) samples for spherical near-field testing. As azimuth arm 14 rotates antenna-under-test 32 is held stationary by anti-spin shaft 28 and anti-spin rotary positioner 30. As elevation arm 18 rotates it deflects changing the distance from the arm tip to the sphere center. The sphere center is the intersection of the axes of rotation of azimuth and elevation positioners 12 and 16. This amount of deflection is known (via calculation or measurement) as a function of elevation arm 18 angle of rotation. Computer 35 knows the elevation arm angle and sends commands to linear positioner 20 to keep probe 22 at a constant distance from the sphere center. Microwave absorber 34 attenuates stray RF reflections that may get into antenna-under-test 32 or RF probe 20.

Where counter-spin rotary positioner 36 is used it receives an opposite command from what azimuth postioner 12 receives. This keeps antenna-under-test 32 stationary as azimuth arm 14 rotates. Anti-spin rotary positioner 30 or counter-spin rotary positioner 36 may rotate the antenna-under-test 32 to check for or minimize the effects of RF reflections. The linear positioner 20 may move the probe 22 to check for or minimize the effects of RF reflections.

Conclusion, Ramifications, and Scope

Accordingly, the reader will see that the probe movement system of this invention greatly improves flexibility, cost, and accuracy of spherical near-field testing of antennas. The antenna being tested can be stationary and in it's normal orientation. This improves accuracy and reduces test cost by not moving cables and waveguides that attach to the antenna. Also, accuracy is improved when gravity or thermal loads are significant. Deflections in the base effect both the antenna position and probe position equally this improves accuracy, and allows a less rigid, cheaper, and more portable base. RF reflections are a significant source of error in near-field testing of antenna. The probe movement system has several features that allow checking and/or minimizing RF reflections. The antenna may be rotated, the RF probe may be moved, and the azimuth arm can be in either of two positions for any give probe position.

While my above description contains many specificities these should not be construed as limitations on the scope of the invention, but rather as an exemplification of one preferred embodiment thereof Many other variations are possible. For example, the elevation positioner and elevation arm can be mounted on the other side of the vertical portion of the azimuth arm; the arms or base may be segmented to facilitate modifications or changes; etc Thus the scope of the invention should be determined by the appended claims and their legal equivalents, rather than by the examples given.

We claim:

1. A probe movement apparatus for use in spherical near-field testing of antennas comprising:
   a. an azimuth rotary positioner mounted on a base,
   b. a bent cantilevered azimuth arm supported and rotated by said azimuth rotary positioner,
   c. a bearing mounted on said bent cantilevered azimuth arm, said bearing supports an antenna being tested and allows rotation of said antenna independent of rotation of said bent cantilevered azimuth arm, said bearing located such that said bearing and said azimuth rotary positioner have coincident rotation axes,
   d. a means for keeping the portion of said bearing that supports said antenna stationary relative to said base while said bent cantilevered azimuth arm is rotated,
   e. an elevation rotary positioner mounted on tip of said bent cantilevered azimuth arm such that axes of rotation of said azimuth rotary positioner and said elevation rotary positioner intersect and are orthogonal,
   f. an bent cantilevered elevation arm supported and rotated by said elevation rotary positioner,
   g. a probe attached to the tip of said bent cantilevered elevation arm,
   h. the azimuth and elevation arms shaped such that appropriate rotation of the arms by the rotary positioners move said probe to any point on a spherical surface which encloses said antenna except those points or areas blocked by apparatus components,
   i. a means to command the positioner's movement.

2. The probe movement apparatus of claim 1 wherein a means is provided to rotate the portions of said bearing that supports said antenna to any arbitrary position relative to said base.

3. The probe movement apparatus of claim 1 wherein a counterweight is attached to said bent cantilevered elevation arm and located such that said bent cantilevered elevation arm balances about the rotation axis of said elevation rotary positioner.

4. The probe movement apparatus of claim 1 wherein a means is provided to adjust the distance between said probe and intersection point of the rotation axes of the rotary positioners.

* * * * *